United States Patent [19]
Botker et al.

[11] Patent Number: 5,764,464
[45] Date of Patent: Jun. 9, 1998

[54] LOW INPUT BIAS CURRENT CIRCUIT

[75] Inventors: Tom Botker; Mark Stitt, II; Rod Burt, all of Tucson, Ariz.

[73] Assignee: Burr-Brown Corporation, Tucson, Ariz.

[21] Appl. No.: 560,139

[22] Filed: Nov. 17, 1995

[51] Int. Cl.$^6$ ........................................ H02H 9/06
[52] U.S. Cl. ........................ 361/56; 361/111; 330/273
[58] Field of Search ........................... 361/18, 56, 58, 361/91, 111, 117, 118, 119, 126, 127; 330/252, 253, 255, 257, 261, 273, 277, 288, 296, 207 P

[56] References Cited

U.S. PATENT DOCUMENTS 4,630,162  12/1986  Bell et al. ............................. 361/56
5,196,981  3/1993   Kuo ...................................... 361/56
5,463,520  10/1995  Nelson .................................. 361/56

*Primary Examiner*—Ronald W. Leja
*Attorney, Agent, or Firm*—Schnader Harrison Segal and Lewis LLP

[57] ABSTRACT

A circuit and method for reducing an input bias current flowing from an external signal source coupled to an input terminal of the circuit, the circuit being coupled to an input device having a device leakage current related to a device voltage. According to a preferred embodiment, a replica voltage source provides a replica voltage equal to the device voltage. A cancellation device is coupled to the replica voltage source so that the replica voltage is applied to the cancellation device. The cancellation device is further coupled to the input terminal for providing a cancellation current equal to the device leakage current, wherein the input bias current is equal to the difference between the device leakage current and the cancellation current.

60 Claims, 4 Drawing Sheets

LOW INPUT BIAS CURRENT CIRCUIT

BACKGROUND OF THE INVENTION

1. Field of the Invention

The present invention relates to low input bias current circuits.

2. Description of the Related Art

Low input bias current circuits, such as amplifiers, are often used in applications with high source impedances to reduce the contribution of the amplifier noise and associated offset. Such low input bias current amplifiers are also used to perform very sensitive measurements, such as leakages, by taking advantage of the amplifier's low input bias current in integrator circuitry.

One problem with present low bias current amplifiers is that, when providing for ESD protection, it is often difficult to maintain low input bias currents, because the ESD circuitry itself draws some leakage or bias current from the external source circuitry supplying the input signal. Referring now to FIG. 1, there is shown a prior art circuit 100 for providing ESD protection for an input device such as operational amplifier ("op amp") 101. Op amp 101 requires ESD protection to protect it from an voltage spike appearing at terminal 102 (caused, for example, by ESD), which can damage op amp 101. Therefore, in the prior art two ESD protection diodes 110 and 111 may be connected as illustrated to input terminal 102 and to positive and negative voltage supplies 120, 121, as illustrated, in order to protect op amp 101 from ESD appearing at terminal 102. In circuit 100, ESD currents are thus shunted to the power supply terminals. Depending on the polarity of a voltage spike, such ESD current will flow to a power supply terminal by forward biasing either diode 110 or 111.

As will be understood, leakage currents $I_{130}$ and $I_{131}$ will flow through diodes 110 and 111, respectively, during the operation of circuit 100. Leakage currents $I_{130}$ and $I_{131}$, will typically differ, causing a bias, or leakage, current $I_{132}$ to flow from or to the external user circuitry source supplying $V_{140}$. As will be appreciated, such a current is referred to herein as a bias current, whether actually caused by a biasing current flowing into a device or whether caused by leakage currents such as referred to above. When the input voltage $V_{140}$ applied to input terminal 102 varies above the midpoint of the positive and negative supply voltages, currents $I_{130}$ and $I_{131}$ may differ by an even greater amount, thereby causing an even greater bias current $I_{132}$. Leakage currents $I_{130}$ and $I_{131}$ may also differ by a greater amount as temperature rises. A bias current $I_{132}$ flowing from or to the external user circuitry supplying the input voltage signal $V_{140}$ is often an undesirable effect of providing ESD protection in this manner because such bias current can produce damaging effects for some external source circuitry such as sensors, or can produce voltage offset errors and noise errors as the input bias current interacts with the source resistance of the source device.

Referring now to FIG. 2, there is shown another prior art circuit 200 for providing ESD protection for an input device. A circuit similar in operation to circuit 200 is described in U.S. Pat. No. 4,630,162, issued Dec. 16, 1986 to Bell et al., the entirety of which is incorporated by reference herein. As illustrated in FIG. 2, prior art circuit 200 employs pnp transistor 210 to reduce the bias current $I_{240}$ by isolating the leakage current of ESD breakdown structure 220 from the input terminal 202. However, currents $I_{241}$, and $I_{242}$ can be present, so that bias current $I_{240}$ is not negligible. Thus, both circuits 100 and 200 are characterized by input bias currents, which also increase with ambient temperature and that vary along with changes in the input voltage within its input common mode voltage range.

Additionally, some input devices themselves draw a bias current from the external user device that supplies an input voltage signal to the input device, independent of any leakage currents in the ESD protection circuitry.

Therefore, there is a need for circuits which reduce the input bias current drawn by input devices or by ESD circuitry.

SUMMARY

There is provided herein a circuit and method for reducing an input bias current flowing from an external signal source coupled to an input terminal of the circuit, the circuit being coupled to an input device having a device leakage current related to a device voltage. According to a preferred embodiment of the invention, a replica voltage source provides a replica voltage equal to the device voltage. A cancellation device is coupled to the replica voltage source so that the replica voltage is applied to the cancellation device. The cancellation device is further coupled to the input terminal for providing a cancellation current equal to the device leakage current, wherein the input bias current is equal to the difference between the device leakage current and the cancellation current.

In another embodiment of the present invention, there is provided a circuit and method for protecting an input device coupled to an input terminal of the circuit from ESD appearing at the input terminal and for reducing an input bias current flowing from an external input voltage source coupled to an input terminal of the circuit. According to this preferred embodiment of the invention, a buffer means coupled to the input device provides an output voltage at an output terminal equal to the input voltage at the input terminal. An ESD protection means is coupled between the output terminal and the input terminal for protecting the input device from ESD events, whereby there is no voltage drop across the ESD protection means.

BRIEF DESCRIPTION OF THE DRAWINGS

These and other features, aspects, and advantages of the present invention will become more fully apparent from the following description, appended claims, and accompanying drawings in which:

DESCRIPTION OF THE PREFERRED EMBODIMENT

The present invention, in a preferred embodiment, provides a circuit that has a low input bias current and that also provides ESD protection of an input device. In a preferred embodiment, a replica bias is employed which tracks the input voltage so as to provide another bias point which cancels the input device's leakage current. The present invention is described in further detail hereinbelow.

Figure 2:
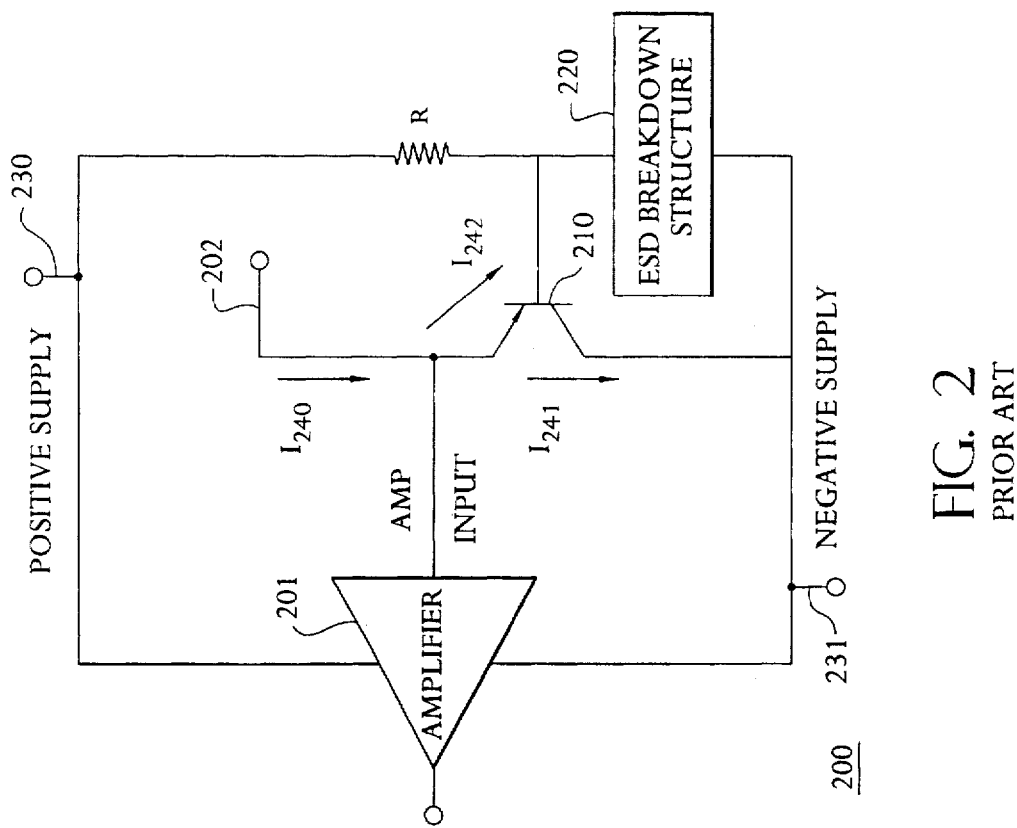
FIG. 2 shows another prior art circuit for providing ESD protection for an input device.
Figure 1:
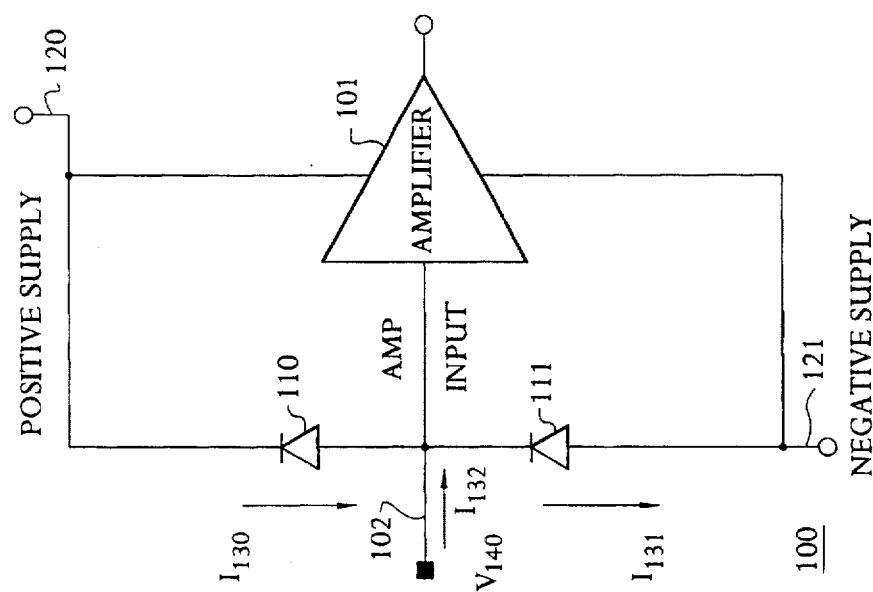
FIG. 1 shows a prior art circuit for providing electrostatic discharge ("ESD") protection for an input device.
Figure 3:
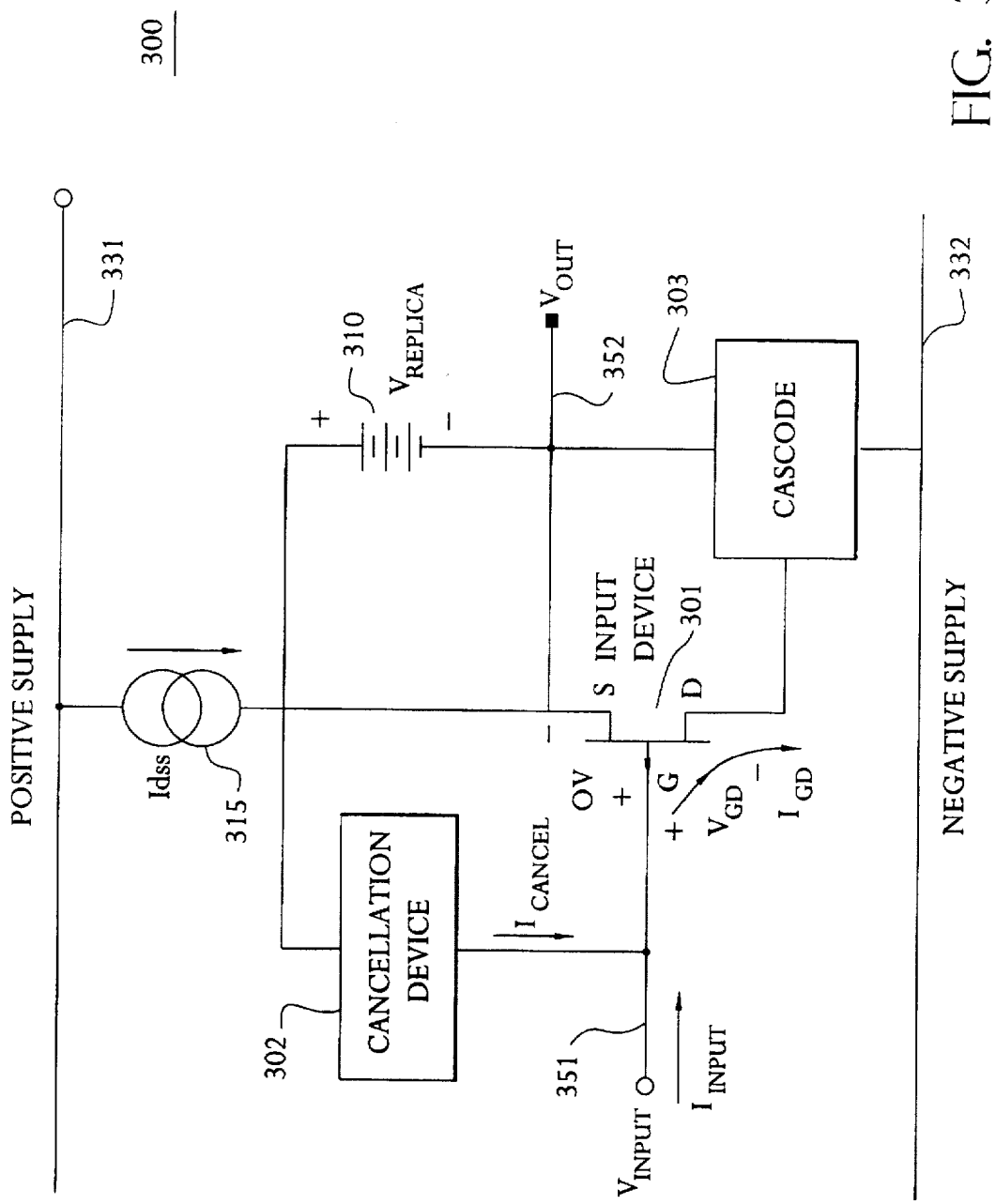
FIG. 3 is a diagram of a circuit in accordance with a preferred embodiment of the present invention.

Referring now to FIG. 3, there is shown a circuit 300 in accordance with a preferred embodiment of the present invention. As illustrated, an input voltage $V_{INPUT}$ is applied to input terminal 351, typically by external user circuitry (not shown). Input device 301 is, in the illustrated embodiment, a junction field-effect transistor (JFET) 301. As will be understood by those skilled in the art, JFET 301 is an input device that receives an input signal $V_{INPUT}$ and provides an output signal $V_{OUT}$ (at output terminal 352) to further circuit elements (not shown). As explained hereinabove, there is a need to protect JFET 301 from ESD appearing at input terminal 351. There is also a need to reduce any bias current $I_{INPUT}$ that would flow from the external input source (not shown) that supplies $V_{INPUT}$ to input terminal 351.

Cascode 303 is coupled as illustrated between the source and drain terminals of JFET 301 and the negative supply voltage terminal 332. Cascode 303, as will be understood, maintains a constant voltage $V_{GD}$ across the gate to drain junction of JFET 301. In alternative preferred embodiments, as will be appreciated, a cascode may be coupled in another manner to maintain a constant voltage $V_{GD}$, for example to the positive supply instead of to the negative supply. JFET 301 is biased by circuit 300 so that there is no voltage across the gate to source junction of JFET 301. Therefore, as will be appreciated, the gate to source junction of JFET 301 will not produce a leakage current flowing across the gate to source junction. However, the gate to drain junction provides a leakage current $I_{GD}$ proportional to $V_{GD}$. Unless canceled, this leakage current $I_{GD}$ would otherwise cause an input bias current $I_{INPUT}$ of the same magnitude to flow. As will be appreciated, leakage current $I_{GD}$ will in general be related to the characteristics of the junction of the input device through which the leakage current flows, and to the voltage existing across this junction.

To cancel this leakage current, which would otherwise flow from input terminal 351, a replica bias voltage $V_{REPLICA}$ is applied by voltage source 310 between cancellation device 302 and output terminal 352 (which is also coupled to the source terminal of JFET 301), as illustrated in FIG. 3. Cancellation device 302 is designed with characteristics (e.g., a junction) similar to that of the input device that give rise to its own leakage current, so that when a matching voltage is applied thereacross a cancellation leakage current will be generated, having the same or nearly the same magnitude of the leakage current of the input device. This cancellation current reduces or eliminates the input bias current $I_{INPUT}$. $V_{REPLICA}$ is the same magnitude as $V_{GD}$, as will be understood, because there is no voltage drop across the gate to source junction of JFET 301. Thus, in circuit 300 a leakage current $I_{CANCEL}$ is provided that cancels leakage current $I_{GD}$.

As discussed hereinabove, $V_{GD}$ may vary slightly with temperature, which may affect the canceling effect discussed herein. As will be appreciated by those skilled in the art, cascode 303 and replica bias voltage $V_{REPLICA}$ may be configured so that temperature variations are taken into account so that $V_{REPLICA}$ tracks the temperature-caused variations in $V_{GD}$ so as to minimize undesirable affects caused by variations in temperature. Thus, in the present invention, even when temperatures rise the input bias current $I_{INPUT}$ is greatly reduced in comparison to prior art circuits and techniques. Additionally, in circuit 300 $I_{INPUT}$ remains very small and relatively constant over the entire input common mode voltage range (i.e., as $V_{INPUT}$ varies within its permissible range).

Figure 4:
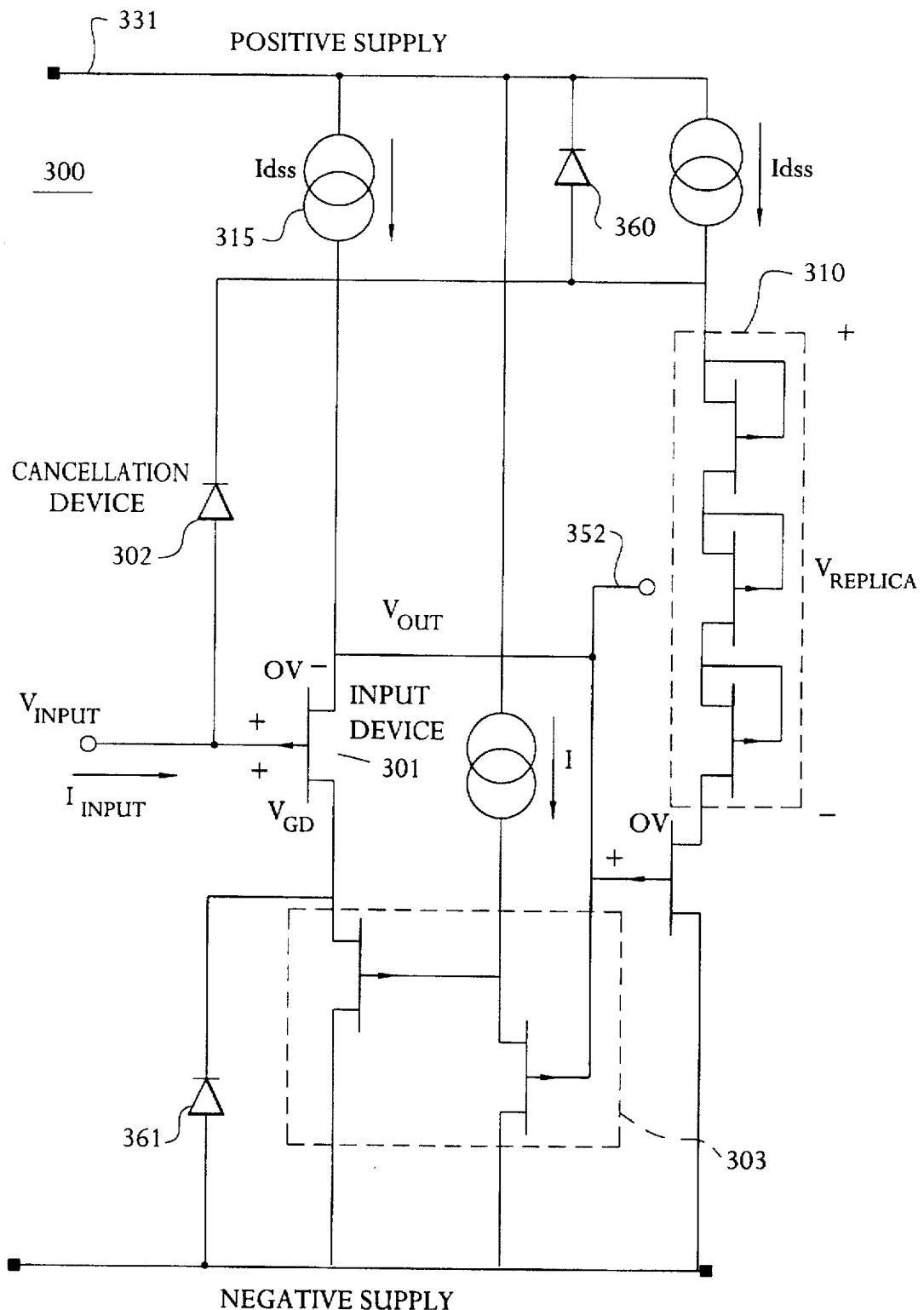
FIG. 4 is a diagram showing further details of a preferred embodiment of the circuit of FIG. 3.

Referring now to FIG. 4, there is shown a diagram showing further details of a preferred embodiment of circuit 300 of FIG. 3 which also provides for ESD protection while still reducing input bias current $I_{INPUT}$. As illustrated in FIG. 4, circuit 300 shunts away positive ESD events to the positive supply at terminal 331 through cancellation device 302, here implemented by diode 302, and through diode 360. Similarly, negative ESD events are shunted through diode 361 and the forward biased gate to drain junction of the input device (JFET 301). Unlike prior art ESD protection circuits, the present invention provides for ESD protection while also providing for extremely low input bias current $I_{INPUT}$.

Figure 5:
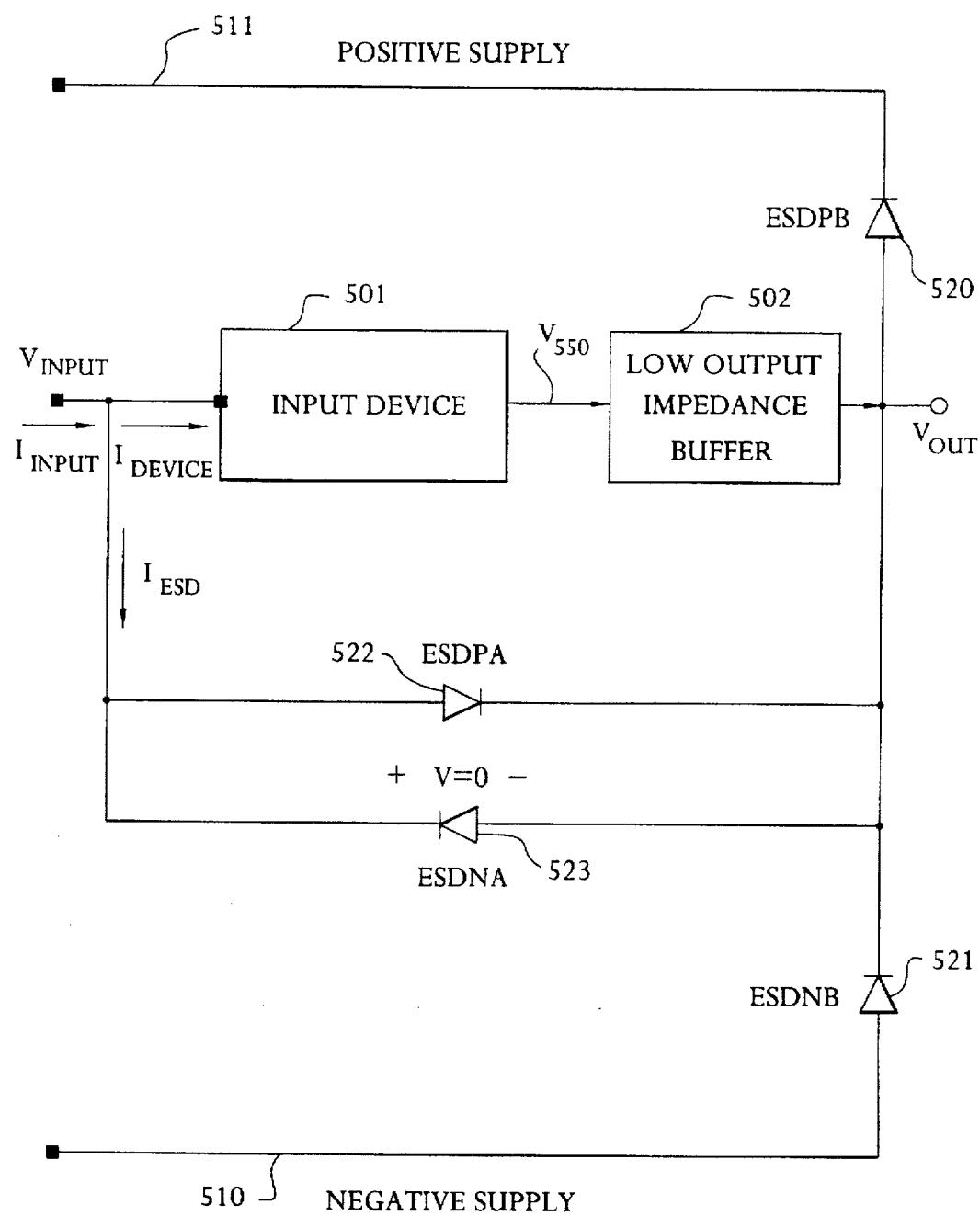
FIG. 5 is a diagram of another circuit in accordance with another preferred embodiment of the present invention.

FIG. 5 is a diagram of another circuit 500 in accordance with another preferred embodiment of the present invention. In circuit 500, input device 501 requires ESD protection and also has an effectively zero input bias current $I_{DEVICE}$. For example, input device 501 may be a CMOS device that requires little or no input current $I_{DEVICE}$. In prior art circuits ESD protection circuitry added to protect the input device would tend to have leakage currents, which would give rise to an input bias current. These problems are alleviated by the present invention. In circuit 500, ESD protection is provided by diodes 520–523. As will be appreciated, positive ESD events are shunted to the positive supply coupled to terminal 511 through diodes 522 and 520. Negative ESD events are shunted to the negative supply coupled to terminal 510 through diodes 521 and 523. Thus, the present circuit 500 provides for ESD protection for input device 501. As will be appreciated, the positive supply is positive relative to the operating voltage range of $V_{INPUT}$ and the negative supply is negative relative to the operating voltage range of $V_{INPUT}$.

Typically the voltage output $V_{550}$ by input device 501 may be equal to $V_{INPUT}$. Alternatively, $V_{550}$ may be a function of $V_{INPUT}$, such as $V_{INPUT}$ minus or plus a small voltage. Low output impedance buffer 502 takes as its input $V_{550}$ and outputs $V_{OUT}$, which is identical in magnitude to $V_{INPUT}$. Thus, if $V_{550}$ is equal to $V_{INPUT}$, then buffer 502 is a unity gain buffer. If $V_{550}$ is instead some function of $V_{INPUT}$, then buffer 502 may be configured so that $V_{OUT}$ equals $V_{INPUT}$. Because $V_{OUT}$ equals $V_{INPUT}$, no current flows across the parallel-coupled diodes 522 and 523. Therefore, $I_{ESD}$ is zero, so that $I_{INPUT}=I_{DEVICE}$, which is very small. Therefore, the input bias current $I_{INPUT}$ is maintained at an extremely small magnitude (in typical embodiments, in the femto amp range) even while providing for ESD protection. Thus, the present invention as embodied in circuit 500 of FIG. 5 provides for ESD protection of an input device while also minimizing input bias current.

\* \* \*

It will be understood that various changes in the details, materials, and arrangements of the parts which have been described and illustrated above in order to explain the nature of this invention may be made by those skilled in the art without departing from the principle and scope of the invention as recited in the following claims.

What is claimed is:

1. A circuit for reducing an input bias current flowing from an external signal source coupled to an input terminal of the circuit, the circuit being coupled to an input device having a device leakage current related to a device voltage, the circuit comprising:

(a) a replica voltage source for providing a replica voltage equal to the device voltage; and (b) cancellation means coupled to the replica voltage source so that the replica voltage is applied to the cancellation means, the cancellation means further being coupled to the input terminal for providing a cancellation current equal to the device leakage current in response to the replica voltage, wherein the input bias current is equal to the difference between the device leakage current and the cancellation current.

2. The circuit of claim 1, further comprising:
(c) voltage regulator means for maintaining a constant device voltage.

3. The circuit of claim 2, wherein the voltage regulator means is a cascode means coupled to the input device.

4. The circuit of claim 1, wherein:
the device leakage current flows across a device junction of the input device and is proportional to the characteristics of the device junction and to the device voltage, the device voltage existing across the device junction; and
the cancellation device has characteristics similar to the characteristics of the device junction.

5. The circuit of claim 1, further comprising:
(c) cascode means coupled to the input device for maintaining a constant device voltage; wherein:
the input device is a junction field-effect transistor (JFET) having a gate, source, and drain;
the gate of the JFET is coupled to the input terminal and to the cancellation means;
the drain of the JFET is coupled to the cascode means;
the source of the JFET is coupled to the cascode means, to the replica voltage source and to an output terminal;
the device voltage is across the gate to drain junction of the JFET; and
the gate to source junction of the JFET is biased to zero volts.

6. The circuit of claim 5, further comprising:
a positive terminal for coupling to a positive voltage supply;
a negative terminal for coupling to a negative voltage supply; and
a current source coupled between the positive terminal and the source of the JFET; wherein:
the replica voltage source is coupled to the cancellation means and to the junction of the output terminal and the source of the JFET;
the cascode means is further coupled to the negative terminal; and
the cancellation means comprises a first diode coupled at its anode to the input terminal and at its cathode to the positive terminal of the replica voltage source.

7. The circuit of claim 6, wherein:
the cascode means comprises a pair of JFETs; and
the replica voltage source comprises a plurality of series-coupled transistors.

8. The circuit of claim 6, further comprising:
electrostatic discharge (ESD) protection means for protecting the input device from ESD appearing at the input terminal.

9. The circuit of claim 8, wherein the ESD protection means comprises:
the first diode and a second diode coupled between the first diode and the positive terminal for shunting positive ESD events; and
a third diode coupled between the negative terminal and the drain of the input device for shunting negative ESD events.

10. The circuit of claim 9, wherein:
the device leakage current flows across the gate to drain junction of the JFET and is proportional to the characteristics of the device junction and to the device voltage, the device voltage existing across the device junction; and
the first diode has characteristics similar to the characteristics of the device junction.

11. The circuit of claim 8, wherein:
the device leakage current flows across the gate to drain junction of the JFET and is proportional to the characteristics of the the gate to drain junction and to the device voltage; and
the first diode has characteristics similar to the characteristics of the the gate to drain junction.

12. The circuit of claim 5, wherein:
the device leakage current flows across the gate to drain junction of the JFET and is proportional to the characteristics of the the gate to drain junction and to the device voltage; and
the cancellation means has characteristics similar to the characteristics of the the gate to drain junction.

13. The circuit of claim 1, further comprising:
electrostatic discharge (ESD) protection means for protecting the input device from ESD appearing at the input terminal.

14. A method for reducing an input bias current flowing from an external signal source coupled to an input terminal of a circuit, the circuit being coupled to an input device having a device leakage current related to a device voltage, the method comprising the steps of:
(a) providing with a replica voltage source a replica voltage equal to the device voltage; and
(b) applying the replica voltage to a cancellation means coupled to the replica voltage source and to the input terminal and providing with the cancellation means a cancellation current equal to the device leakage current in response to the replica voltage, wherein the input bias current is equal to the difference between the device leakage current and the cancellation current.

15. The method of claim 14, further comprising the step of:
(c) maintaining a constant device voltage with a voltage regulator means.

16. The method of claim 15, wherein the voltage regulator means is a cascode means coupled to the input device.

17. The method of claim 14, wherein:
the device leakage current flows across a device junction of the input device and is proportional to the characteristics of the device junction and to the device voltage, the device voltage existing across the device junction; and
the cancellation device has characteristics similar to the characteristics of the device junction.

18. The method of claim 14, further comprising the step of:
(c) maintaining a constant device voltage with a cascode means coupled to the input device;
wherein:
the input device is a junction field-effect transistor (JFET) having a gate, source, and drain;
the gate of the JFET is coupled to the input terminal and to the cancellation means;
the drain of the JFET is coupled to the cascode means;
the source of the JFET is coupled to the cascode means, to the replica voltage source and to an output terminal;
the device voltage is across the gate to drain junction of the JFET; and the gate to source junction of the JFET is biased to zero volts.

19. The method of claim 18, wherein the circuit further comprises:

a positive terminal for coupling to a positive voltage supply;

a negative terminal for coupling to a negative voltage supply; and a current source coupled between the positive terminal and the source of the JFET; wherein:

the replica voltage source is coupled to the cancellation means and to the junction of the output terminal and the source of the JFET;

the cascode means is further coupled to the negative terminal; and the cancellation means comprises a first diode coupled at its anode to the input terminal and at its cathode to the positive terminal of the replica voltage source.

20. The method of claim 19, wherein:

the cascode means comprises a pair of JFETs; and the replica voltage source comprises a plurality of series-coupled transistors.

21. The method of claim 19, further comprising the step of:

(d) protecting with an electrostatic discharge (ESD) protection means the input device from ESD appearing at the input terminal.

22. The method of claim 21, wherein the ESD protection means comprises:

the first diode and a second diode coupled between the first diode and the positive terminal for shunting positive ESD events; and a third diode coupled between the negative terminal and the drain of the input device for shunting negative ESD events.

23. The method of claim 22, wherein:

the device leakage current flows across a device junction of the input device and is proportional to the characteristics of the device junction and to the device voltage, the device voltage existing across the device junction; and the first diode has characteristics similar to the characteristics of the device junction.

24. The method of claim 21, wherein:

the device leakage current flows across the gate to drain junction of the JFET and is proportional to the characteristics of the the gate to drain junction and to the device voltage; and the first diode has characteristics similar to the characteristics of the the gate to drain junction.

25. The method of claim 18, wherein:

the device leakage current flows across the gate to drain junction of the JFET and is proportional to the characteristics of the the gate to drain junction and to the device voltage; and the cancellation means has characteristics similar to the characteristics of the the gate to drain junction.

26. The method of claim 14, further comprising the step of:

(c) protecting, with an electrostatic discharge (ESD) protection means, the input device from ESD appearing at the input terminal.

27. A circuit for reducing an input bias current flowing from an external signal source coupled to an input terminal of the circuit, the circuit being coupled to an input device having a device leakage current related to a device voltage, the circuit comprising:

(a) a replica voltage source having a replica voltage equal to the device voltage; and (b) a cancellation device, wherein:

the replica voltage source is coupled to the cancellation device so that the replica voltage is applied across the cancellation device;

the cancellation device is coupled to the input terminal and provides a cancellation current in response to the replica voltage;

the input bias current is equal to the difference between the device leakage current and the cancellation current;

the device leakage current flows across a device junction of the input device and is proportional to the characteristics of the device junction and to the device voltage, the device voltage existing across the device junction; and the cancellation device has characteristics similar to the characteristics of the device junction so that, when the replica voltage is applied across the cancellation device the cancellation device provides the cancellation current having a magnitude equal to the magnitude of the device leakage current.

28. The circuit of claim 27, further comprising:

(c) a cascode means coupled to the input device that maintains a constant device voltage.

29. The circuit of claim 28, wherein:

the input device is a junction field-effect transistor (JFET) having a gate, source, and drain;

the gate of the JFET is coupled to the input terminal and to the cancellation device;

the drain of the JFET is coupled to the cascode means;

the source of the JFET is coupled to the cascode means, to the replica voltage source and to an output terminal;

the device voltage is across the gate to drain junction of the JFET; and the gate to source junction of the JFET is biased to zero volts.

30. The circuit of claim 29, further comprising:

a positive terminal coupled to a positive voltage supply;

a negative terminal for coupled to a negative voltage supply; and a current source coupled between the positive terminal and the source of the JFET; wherein:

the replica voltage source is coupled to the cancellation device and to the junction of the output terminal and the source of the JFET;

the cascode means is further coupled to the negative terminal; and the cancellation device comprises a first diode coupled at its anode to the input terminal and at its cathode to a positive terminal of the replica voltage source.

31. The circuit of claim 30, wherein:

the cascode means comprises a pair of JFETs; and the replica voltage source comprises a plurality of series-coupled transistors.

32. The circuit of claim 31, further comprising:

the first diode and a second diode coupled between the first diode and the positive terminal for shunting positive ESD events; and a third diode coupled between the negative terminal and the drain of the input device for shunting negative ESD events appearing at the input terminal.

33. A circuit for protecting an input device coupled to an input terminal of the circuit from electrostatic discharge (ESD) appearing at the input terminal and for reducing an input bias current flowing from an external input voltage source coupled to the input terminal, the circuit comprising:
(a) buffer means coupled to the input device for providing an output voltage at an output terminal of the circuit equal to the input voltage at the input terminal; and
(b) ESD protection means coupled between the output terminal and the input terminal for protecting the input device from ESD events, whereby there is no voltage drop across the ESD protection means.

34. The circuit of claim 33, wherein the input device has no input leakage current.

35. The circuit of claim 34, wherein the input device comprises a CMOS input device.

36. The circuit of claim 33, wherein:
the input device provides a device output voltage at a device output terminal coupled to a buffer input terminal of the buffer means;
the device output voltage is a function of the input voltage; and
the buffer means comprises means for deriving the output voltage from the device output voltage.

37. The circuit of claim 36, wherein:
the device output voltage is equal to the input voltage; and
the buffer means comprises a unity gain buffer means for deriving the output voltage from the device output voltage.

38. The circuit of claim 36, wherein:
the device output voltage is equal to the input voltage minus a difference voltage; and
the buffer means comprises means converting the device output voltage to the output voltage by adding the difference voltage to the device output voltage.

39. The circuit of claim 36, wherein the input device has no input leakage current.

40. The circuit of claim 39, wherein the input device comprises a CMOS input device.

41. The circuit of claim 33, wherein the ESD protection means comprises a first positive diode coupled at its anode to the input terminal and at its cathode to the output terminal and a first negative diode coupled at its cathode to the input terminal and at its anode to the output terminal.

42. The circuit of claim 41, the circuit further comprising:
a positive terminal for coupling to a positive voltage supply;
a negative terminal for coupling to a negative voltage supply;
a second positive diode coupled between the output terminal and the positive terminal for shunting positive ESD events; and
a second negative diode coupled between the output terminal and the negative terminal for shunting negative ESD events.

43. The circuit of claim 42, wherein:
the input device provides a device output voltage at a device output terminal coupled to a buffer input terminal of the buffer means;
the device output voltage is a function of the input voltage;
the buffer means comprises means for deriving the output voltage from the device output voltage; and
the input device has no input leakage current.

44. The circuit of claim 41, wherein:
the input device provides a device output voltage at a device output terminal coupled to a buffer input terminal of the buffer means;
the device output voltage is a function of the input voltage;
the buffer means comprises means for deriving the output voltage from the device output voltage; and
the input device has no input leakage current.

45. A method for protecting an input device coupled to an input terminal of a circuit from electrostatic discharge (ESD) appearing at the input terminal and for reducing an input bias current flowing from an external input voltage source coupled to the input terminal, the method comprising the steps of:
(a) providing, with a buffer means of the circuit coupled to the input device, an output voltage at an output terminal of the circuit equal to the input voltage at the input terminal; and
(b) protecting the input device from ESD events with an ESD protection means of the circuit coupled between the output terminal and the input terminal, whereby there is no voltage drop across the ESD protection means.

46. The method of claim 45, wherein the input device has no input leakage current.

47. The method of claim 46, wherein the input device comprises a CMOS input device.

48. The method of claim 45, further comprising the step of:
providing, with the input device, a device output voltage at a device output terminal coupled to a buffer input terminal of the buffer means; wherein:
the device output voltage is a function of the input voltage; and
step (a) comprises the step of deriving, with the buffer means, the output voltage from the device output voltage.

49. The method of claim 48, wherein:
the device output voltage is equal to the input voltage; and
the buffer means comprises a unity gain buffer means for deriving the output voltage from the device output voltage.

50. The method of claim 48, wherein:
the device output voltage is equal to the input voltage minus a difference voltage; and
the buffer means comprises means converting the device output voltage to the output voltage by adding the difference voltage to the device output voltage.

51. The method of claim 48, wherein the input device has no input leakage current.

52. The method of claim 51, wherein the input device comprises a CMOS input device.

53. The method of claim 45, wherein the ESD protection means comprises a first positive diode coupled at its anode to the input terminal and at its cathode to the output terminal and a first negative diode coupled at its cathode to the input terminal and at its anode to the output terminal.

54. The method of claim 53, the method further comprising:
a positive terminal for coupling to a positive voltage supply;
a negative terminal for coupling to a negative voltage supply;
a second positive diode coupled between the output terminal and the positive terminal for shunting positive ESD events; and a second negative diode coupled between the output terminal and the negative terminal for shunting negative ESD events.

55. The method of claim 54, further comprising the step of:

providing, with the input device, a device output voltage at a device output terminal coupled to a buffer input terminal of the buffer means; wherein:

the device output voltage is a function of the input voltage;

step (a) comprises the step of deriving, with the buffer means, the output voltage from the device output voltage; and the input device has no input leakage current.

56. The method of claim 53, further comprising the step of:

providing, with the input device, a device output voltage at a device output terminal coupled to a buffer input terminal of the buffer means; wherein:

the device output voltage is a function of the input voltage;

step (a) comprises the step of deriving, with the buffer means, the output voltage from the device output voltage; and the input device has no input leakage current.

57. A circuit for protecting an input device coupled to an input terminal of the circuit from electrostatic discharge (ESD) appearing at the input terminal and for reducing an input bias current flowing from an external input voltage source coupled to the input terminal, wherein the input device provides a device output voltage at a device output terminal, the circuit comprising:

(a) a buffer device coupled to the device output terminal and to an output terminal of the circuit, wherein the buffer device transforms the device output voltage to an output voltage at the output terminal having the same magnitude as the input voltage; and (b) a first positive diode coupled at its anode to the input terminal and at its cathode to the output terminal and a first negative diode coupled at its cathode to the input terminal and at its anode to the output terminal, whereby there is no voltage drop across the first positive diode and the first negative diode.

58. The circuit of claim 57, wherein the input device has no input leakage current.

59. The circuit of claim 58, wherein the input device comprises a CMOS input device.

60. The circuit of claim 59, the circuit further comprising:

a positive terminal coupled to a positive voltage supply;

a negative terminal coupled to a negative voltage supply;

a second positive diode coupled at its anode to the output terminal and at its cathode to the positive terminal; and a second negative diode coupled at its cathode to the output terminal and at its anode to the negative terminal.

* * * * *